| (12) | United States Patent | (10) Patent No.: | US 6,320,753 B1 |
|---|---|---|---|
| | Launay | (45) Date of Patent: | Nov. 20, 2001 |

(54) INTEGRATED CIRCUIT BOARD COMBINING EXTERNAL CONTACT ZONES AND AN ANTENNA, AND PROCESS FOR MANUFACTURING SUCH A BOARD

(75) Inventor: Francois Launay, Epron (FR)

(73) Assignee: Oberthur Card Systems SA, Paris (FR)

( * ) Notice: Subject to any disclaimer, the term of this patent is extended or adjusted under 35 U.S.C. 154(b) by 0 days.

(21) Appl. No.: 09/154,739

(22) Filed: Sep. 17, 1998

(30) Foreign Application Priority Data

Oct. 7, 1997 (FR) .................................................. 97 12491

(51) Int. Cl.[7] .................................................. H05K 1/18
(52) U.S. Cl. .................. 361/760; 361/761; 361/777; 174/52.1; 174/255; 174/260; 257/531; 257/679; 29/840; 29/841
(58) Field of Search .................... 361/760, 737, 361/764, 761, 777, 783; 174/52.2, 260, 255, 52.1; 257/679, 728, 531; 228/180.21; 29/840, 841

(56) References Cited

U.S. PATENT DOCUMENTS

| 5,574,470 | * | 11/1996 | De Vall ................................ 343/895 |
| 5,598,032 | | 1/1997 | Fidalgo ................................ 257/679 |
| 5,847,931 | * | 12/1998 | Gaumet et al. ........................ 361/737 |
| 5,850,690 | * | 12/1998 | Launay et al. ........................ 29/841 |
| 5,856,912 | * | 1/1999 | Miller et al. ......................... 361/737 |
| 5,880,934 | * | 3/1999 | Haghiri-Tehrani .................... 361/737 |
| 5,909,050 | * | 6/1999 | Furey et al. .......................... 257/531 |
| 5,914,862 | * | 6/1999 | Ferguson et al. ..................... 361/737 |
| 5,996,897 | * | 12/1999 | Prancz ................................. 235/492 |
| 6,008,993 | * | 12/1999 | Kreft ................................... 361/737 |
| 6,028,774 | * | 2/2000 | Shin et al. ............................ 361/764 |
| 6,049,461 | * | 4/2000 | Haghiri-Tehrani et al. ......... 361/737 |
| 6,049,463 | * | 4/2000 | O'Malley et al. .................... 361/760 |

FOREIGN PATENT DOCUMENTS

| 196 01 203 A1 | 3/1997 | (DE) . |
| 0 063 347 A1 | 10/1982 | (EP) . |
| 0 682 321 A2 | 11/1995 | (EP) . |
| 0 688 051 A1 | 12/1995 | (EP) . |
| 0 706 152 A2 | 4/1996 | (EP) . |
| 0 723 244 A2 | 7/1996 | (EP) . |

* cited by examiner

Primary Examiner—Leo P. Picard
Assistant Examiner—David Foster
(74) Attorney, Agent, or Firm—Oliff & Berridge, PLC

(57) ABSTRACT

Integrated circuit board combining external contact zones and an antenna to receive data transmitted by a terminal, and process for manufacturing such a board.

The integrated circuit board in accordance with the invention comprises a single integrated circuit connected both to an antenna by connection terminals and to external contact zones by other connection terminals; the antenna is arranged between a support and a strip; the above-mentioned connection terminals are arranged opposite the corresponding connection ends of the integrated circuit and are respectively connected to them; the integrated circuit is arranged by a process know by the name "flip-chip" in a cavity in which the connection terminals of the antenna and those of the external contact zones are accessible.

The board in accordance with the invention may by used both with a reader connected to the external contact zones or with a terminal transmitting data without contacts, by means of the antenna.

14 Claims, 4 Drawing Sheets

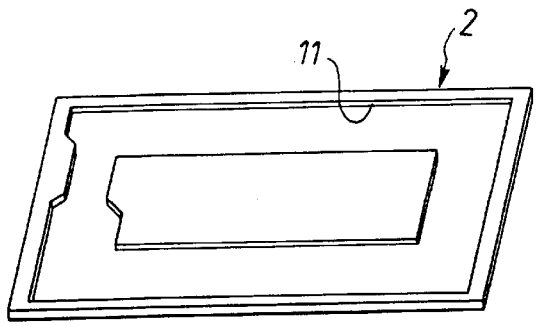
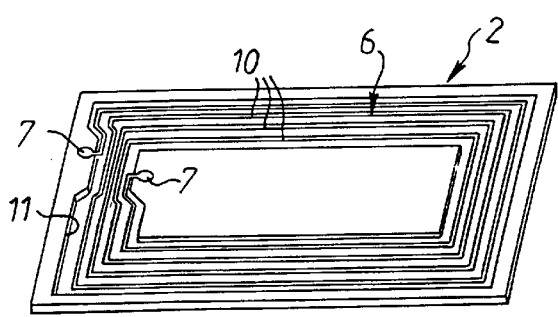
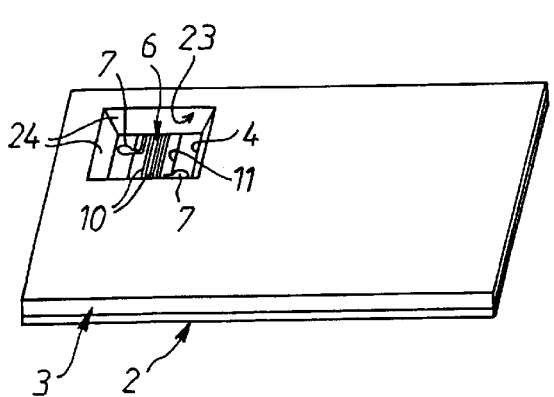
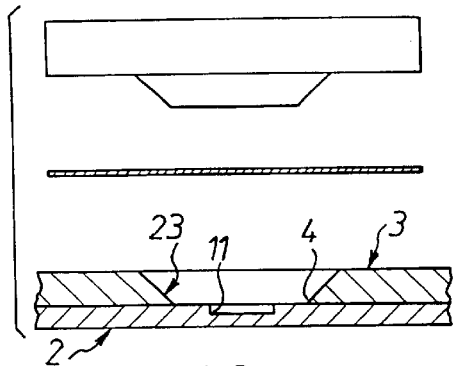
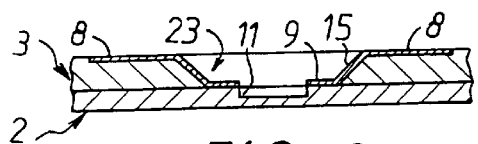
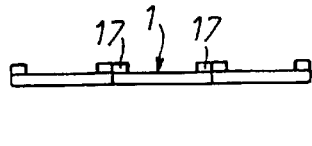
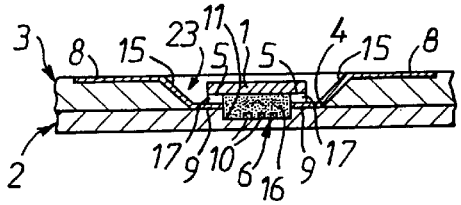
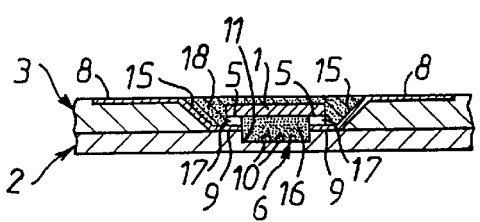

INTEGRATED CIRCUIT BOARD COMBINING EXTERNAL CONTACT ZONES AND AN ANTENNA, AND PROCESS FOR MANUFACTURING SUCH A BOARD

FIELD OF THE INVENTION

The present invention relates to an integrated circuit board device and a process for manufacturing such a board. More precisely, it relates to an integrated circuit board which operates both using data transmitted by contacts or using data transmitted by an antenna, i.e. without contacts.

DESCRIPTION OF THE PRIOR ART

A board is already known which operates using both data transmitted by contacts or using data transmitted without contacts. European patent EP 0706152 mentions such a board. It is provided with two integrated circuits: one is employed for use of the board via contacts, the other is employed for use of the board without contacts, via an antenna. The disadvantage of such a board is the cost due to the use and construction of two integrated circuits.

A board is also known which only employs a single integrated circuit and which operates both using data transmitted via contacts or data transmitted without contacts. U.S. Pat. No. 5,598,032 describes such a board. It has a module which supports the integrated circuit. This module consists of external contact zones separated by insulators and of an integrated circuit fixed above them. Connections are necessary between the integrated circuit and the external contact zones; they are generally provided by wires. The module has other connections which connect the integrated circuit to the antenna. One disadvantage of such a board is linked to the fact that such a module can be removed without destruction of its support and may thus be used fraudulently. Another disadvantage arises from the complexity of manufacture of a module: this involves a high cost.

SUMMARY OF THE INVENTION

More precisely, the invention relates to an integrated circuit board comprising a support, a strip fixed onto the support, a cavity at least partially defined in the support and/or the strip, an integrated circuit provided with connection ends and arranged in the said cavity, an antenna provided with connection terminals and arranged between the said support and the said strip, and external contact zones connected to other connection terminals, the said integrated circuit being connected both to the antenna and to the external contact zones, characterised by the fact that the above-mentioned connection terminals are arranged opposite corresponding connection ends of the integrated circuit and are respectively connected to them.

The invention improves the embedding of the integrated circuit in a board to prevent fraudulent use. The invention permits the manufacturing cost of such a board to be reduced by arranging and directly connecting the integrated circuit on the board. It also simplifies the manufacture of such a board. The advantages will become more clearly apparent in the course of the following description.

The support and the strip generally consist of a thermoplastic material. The above-mentioned cavity may be formed in the support or in the strip or may also be defined in the assembly consisting of the support and the strip. This cavity may consist of a space between the support and the strip. This cavity is intended to house an integrated circuit. This integrated circuit is provided with connection ends. An antenna, provided with connection terminals, is arranged between the support and the strip. This allows the antenna to be protected and its appearance to be avoided. External contact zones gather data by contact. These external contact zones may advantageously be irremovably embedded in the board. They are connected to connection terminals, which connect the external contact zones to the integrated circuit. The integrated circuit is connected both to the antenna, by means of the antenna connection terminals, and to the external contact zones, by means of the connection terminals connected to the external contact zones. These connection terminals are arranged opposite the corresponding connection ends of the integrated circuit and are connected to the corresponding connection ends of the integrated circuit. This feature of the assembly avoids production of a module; it also avoids connection wires between the external connection zones and the connection ends. The assembly of connection terminals is connected directly to the corresponding connection ends of the integrated circuit, optionally with interposition of conductive excrescences as will be seen below.

The antenna may have various configurations. It may be an electromagnetic coil. It may thus in particular include turns: in this case the antenna may be passed under the integrated circuit defining a grouping of the connection terminals connected to the external contact zones in two assemblies such that the turns pass between the said two assemblies. This configuration avoids passing an antenna connection over the turns. Constriction of the turns may be necessary at the passage of the turns between the two assemblies of connection terminals. The antenna may, for example, be produced by hot-stamping, or by deposition of a wire of conductive material, or by silk-screen printing of a conductive ink or a conductive resin, or by photogravure or tampography. Hot-stamping is particularly described in European patent EP 0 063 347. A groove may be formed to contain the antenna. This groove may be formed in the support, or in the strip, or in the assembly consisting of the support and the strip.

The external contact zones are preferably formed by hot-stamping. Most frequently connection tracks connect the external contact zones to the respective connection terminals; in this case the external contact zones, the connection terminals of the external contact zones and the connection tracks may be produced at the same time, for example by hot-stamping.

The integrated circuit is irremovably firmly fixed in the cavity. To achieve this, the integrated circuit is generally bonded. An anisotropic adhesive may be used; it also facilitates the connection between the connection terminals and the connection ends of the integrated circuit. An insulating adhesive may also be used; it allows good isolation of the different conductive elements which are not intended to be connected.

A conductive adhesive deposited on at least certain connection ends of the integrated circuit and/or certain connection terminals also permits fixing and connection of the integrated circuit.

Conductive excrescences may be present on at least certain of the connection ends of the integrated circuit and/or on certain of the connection terminals; they facilitate connection between the connection ends of the integrated circuit and the corresponding connection terminals. When insulating adhesive is used, application of the integrated circuit with a controlled pressure drives the adhesive to the contact points, particularly in the presence of conductive excrescences; a good connection is thus obtained between the connection terminals and the connection ends of the integrated circuit, optionally via conductive excrescences. When anisotropic adhesive is used, squeezing of the adhesive at the contact points permits good electrical connection, in particular in the presence of conductive excrescences. These conductive excrescences are formed of a conductive material, for example metal or conductive adhesive. A conductive adhesive may also be deposited on at least certain conductive excrescences, to effect the connections.

A protective resin arranged on or around the integrated circuit protects the latter.

In accordance with an embodiment of the invention, the external contact zones and the connection terminals of the said external contact zones may by arranged on the strip. It may be advantageous, particularly in this embodiment, to use two or more conductive excrescences superimposed between connection ends and corresponding connection terminals; this facilitates connection between the said connection ends and the said corresponding connection terminals when the distance between these corresponding elements, which are to be connected, is large.

In accordance with a further embodiment, the external contact zones and the antenna may be arranged on the support.

The invention also relates to a process for manufacture of an integrated circuit board, the said integrated circuit being provided with connection ends, comprising the production of a structure consisting of a support, of a strip fixed to the support, of an antenna provided with connection terminals and arranged between the said support and the said strip and of a cavity defined at least partially in the support and/or the strip characterised by the fact that it comprises the production of external contact zones connected to connection terminals, the assembly of the connection terminals being arranged in a configuration corresponding to that of the connection ends of an integrated circuit, and by the fact that it comprises a step consisting of arranging and connecting the said integrated circuit by so-called "flip-chip" assembly to the connection terminals. "Flip-chip" means the operation, itself known, described in European patent No. 0688051, which consists of fixing the integrated circuit and connecting it to the corresponding connection terminals.

In accordance with one possibility, the antenna may be deposited by hot-stamping. It may also be produced either by deposition of a wire of conductive material or by silk-screen printing of a conductive ink or of a conductive resin, or by photogravure, or also by tampography.

The manufacturing process may include the creation of a groove on the support or in the strip or in the assembly formed by the support and the strip: this groove is intended to house the antenna.

During hot-stamping, increased thicknesses, due in particular to creep, are apt to appear on the support and/or on the strip; these increased thicknesses can be flattened out, for example by means of a flat tool.

A particular manufacturing process in accordance with the invention consists of using an adhesive which exhibits collapse on hardening: such an adhesive improves the contacts between the connection terminals and the integrated circuit, in particular when the board is flexed.

In accordance with one manufacturing process, the external contact zones and the antenna may be produced in the same operation.

The process may include the creation of conductive excrescences. These may be created by thermosonic melting of a wire. Such thermosonic melting is itself known.

BRIEF DESCRIPTION OF THE DRAWINGS

The attached drawings illustrate the invention by way of example.

FIGS. 8 to 16 show the essential steps of an example of a process for manufacture of a board in accordance with the invention;

DESCRIPTION OF THE EMBODIMENTS

Figure 1:
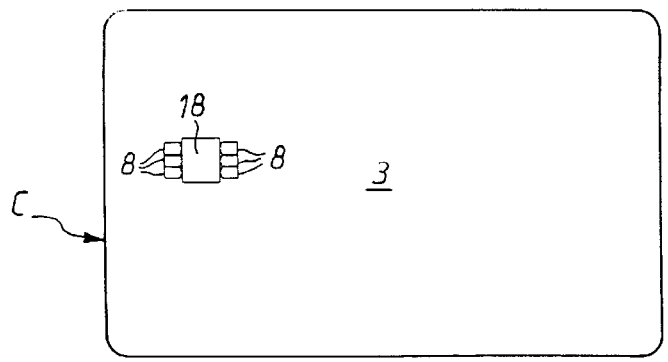
FIG. 1 shows an example embodiment of a board in accordance with the invention, seen from above.
Figure 2:
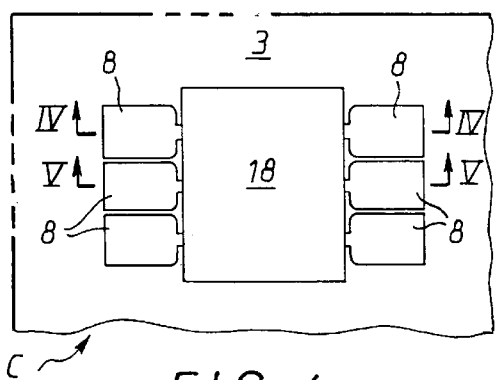
FIG. 2 shows an enlargement of the zone which contains the integrated circuit on the board of FIG. 1, seen partially from above.
Figure 3:
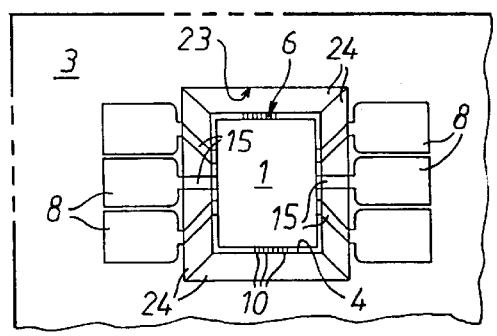
FIG. 3 shows an enlargement of the same zone of the board as FIG. 2, without showing the protective resin, seen partially from above.
Figure 4:
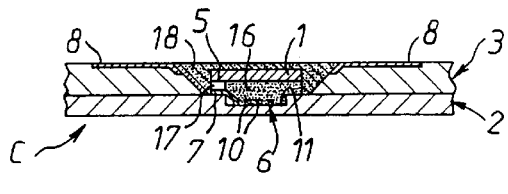
FIG. 4 shows the section IV—IV of FIG. 2.
Figure 5:
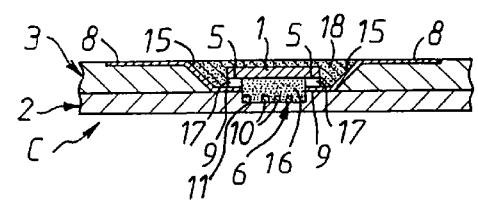
FIG. 5 shows the section V—V of FIG. 2.
Figure 6:
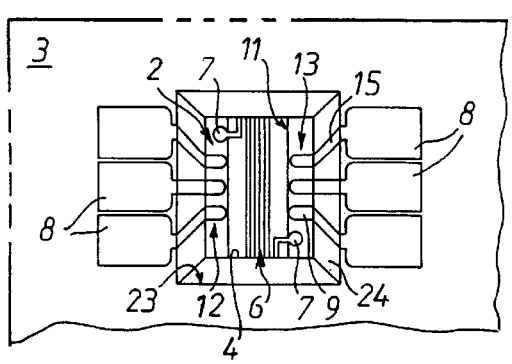
FIG. 6 shows an enlargement of the same zone of the board as FIG. 2, without the protective resin or the integrated circuit being shown, seen partially from above.
Figure 7:
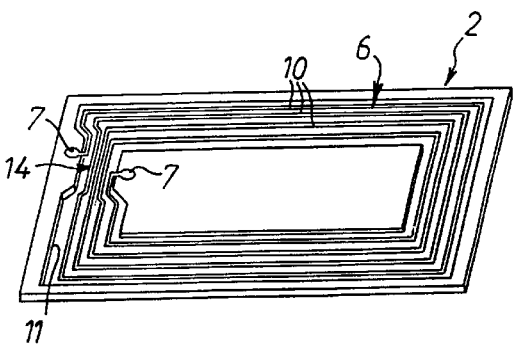
FIG. 7 shows a perspective view of a support provided with a groove in which an antenna is arranged.

A first example embodiment of a board in accordance with the invention will be described with reference to FIGS. 1 to 7. Such a board C includes an integrated circuit 1, a support 2, a strip 3 fixed onto the support and a cavity 4 defined at least partially in the support and/or the strip. In the example, the cavity is formed by means of a window 23 cut into the strip. The base of the cavity is formed by the support 2. The integrated circuit is provided with connection ends 5 and is arranged in the said cavity. An antenna 6 provided with connection terminals 7, which appear at the base of the cavity, is arranged between the said support and the said strip. External contact zones 8 are connected to connection terminals 9, which are arranged at the base of the cavity. The integrated circuit is connected both to the antenna and to the external contact zones. The assembly of connection terminals 7, 9 is arranged opposite the corresponding connection ends of the integrated circuit and are connected to the said corresponding connection ends of the integrated circuit.

In the form of embodiment of FIGS. 1 to 7, the antenna includes turns 10, deposited in a groove 11. The connection terminals of the external contact zones have been grouped into two assemblies (12 and 13 respectively) such that the turns of the antenna pass between the two assemblies. This can be seen in FIG. 6, which shows on the one hand (to the left of the visible turn fragments), an assembly 12 of three external contact zone connection terminals and, on the other (to the right of the visible turn fragments), another assembly 13 of three external contact zone connection terminals.

The turns of the antenna have a constriction 14 at their passage between the said two assemblies. The support has a groove 11 and the antenna is arranged in the said groove. The external contact zones 8 are connected to the respective connection terminals 9 by connection tracks 15 which extend along the inclined sides 24 of the window. The integrated circuit is fixed by an insulating adhesive 16. It has conductive excrescences 17 on all its connection ends. A protective resin 18 coats and protects the integrated circuit.

The protective resin and the adhesive may optionally be of the same nature.

With reference to FIGS. 8 to 16, an example of a process for manufacture of a board in accordance with FIGS. 1 to 7 will now be described.

A groove 11 is machined in a support. A support provided directly with a groove may also be used, produced for example in moulded plastics, as shown in FIG. 8. An antenna is deposited in the groove; FIG. 9 shows the result of this operation. This antenna may be deposited for example by hot-stamping on the support. It may also be deposited either by silk-screen printing of a conductive ink or of a conductive resin, or by photogravure, or also by tampography. It may also be created by deposition of a wire of conductive material. A strip is then fixed onto the support; this strip is provided with a window which reveals the connection terminals of the antenna (FIG. 10). FIG. 11 shows in section and diagrammatically how the external contact zones, the connection terminals of the external contact zones and the connection tracks connecting the external contact zones to the connection terminals of the external contact zones are created by hot-stamping in one operation. FIG. 12 shows, in section, the result of such hot-stamping. Independently of this operation, conductive excrescences 17, currently called "bumps" in the art, are deposited on the integrated circuit connection ends. In known manner, a plurality of identical integrated circuits is defined on a same substrate or "wafer". Final dicing of this substrate produces the individual integrated circuits. The conductive excrescences are created on each integrated circuit before fragmentation of the substrate. This is illustrated diagrammatically in FIG. 13, in which a part of the substrate is shown in section before it is diced, each integrated circuit already including is excrescences. After dicing (conventional and not shown) which creates the individual integrated circuits, one of them (FIG. 14) is lifted and turned in the cavity to be fixed there and connected to the connection terminals (FIG. 15); this is the "flip-chip" operation. The connection terminals are so arranged that they correspond respectively to the connections defined on the integrated circuit. In FIGS. 14 and 15 adhesive is deposited in the cavity and the integrated circuit is arranged in the cavity. obviously the integrated circuit may be coated with adhesive and then bonded in the cavity. In a preferred embodiment, adhesive which exhibits collapse on hardening is used to bond the integrated circuit; in fact the conductive excrescences arranged on the connection ends of the integrated circuit are then applied forcibly against the connection terminals, this improving electrical contact. Protective resin is then deposited in the cavity. The result of this operation is shown, in section, in FIG. 16.

Figure 17:
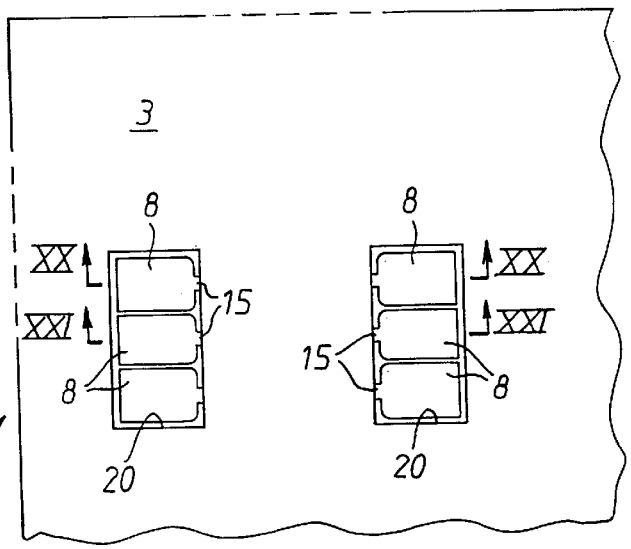
FIGS. 17 to 21 show an example of manufacture of a board in accordance with the invention; and, FIGS. 22 to 27 show another example of manufacture of a board in accordance with the invention.

FIGS. 17 to 21 show another embodiment of a board in accordance with the invention. FIG. 17 shows a partial view from above of a board in accordance with this embodiment. Two windows 20 arranged in a strip permit access to the external contact zones of the board.

Figure 18:
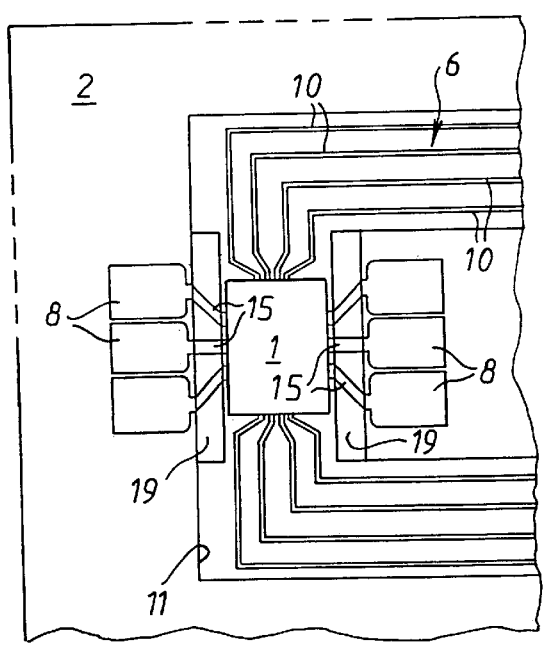

FIG. 18 shows a partial view from above of the board, in which both the strip and the protective resin have been removed.

Figure 19:
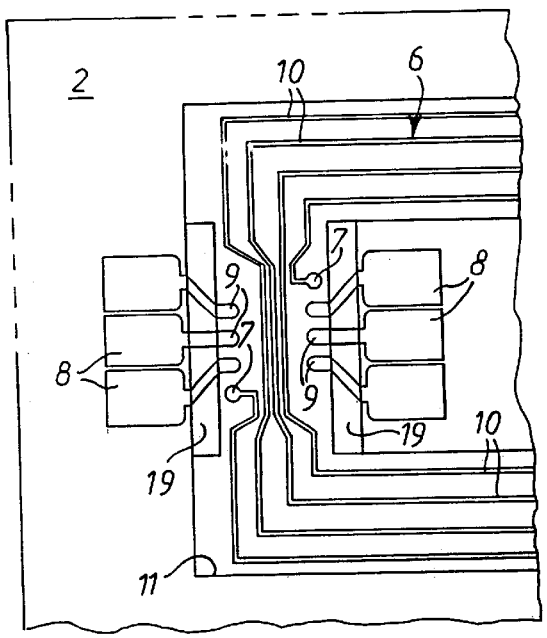

FIG. 19 shows the support seen partially from above. A groove 11 is present in this support. The antenna is arranged in this groove. The external contact zones are arranged on the upper surface of the support close to the cavity. The connection terminals are all arranged at the base of the groove. This groove has inclined sides 19; the connection tracks extend along the contours of these inclined sides.

Variations may obviously be imagined without departing from the scope of the present invention: for example, the inclined sides may be absent from the edge of the groove or be present on all or part of the edge of the groove. An advantage of this embodiment arises from the fact that both the antenna, provided with its connection terminals, and the assembly formed by the external contact zones, the connection terminals of the external contact zones and the connection tracks connecting the external contact zones to the connection terminals of the external contact zones may be produced simultaneously in a single operation. All these elements may be produced by hot-stamping, for example.

Figure 20:
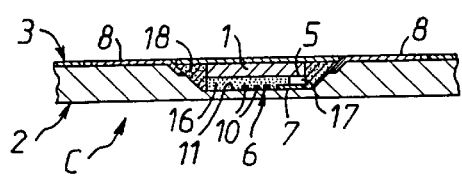
Figure 21:
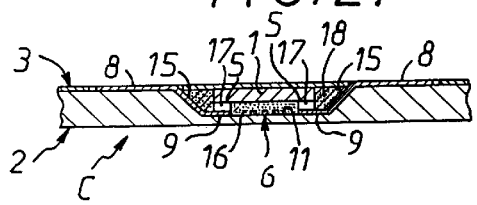

FIGS. 20 and 21 are partial sections of the board in accordance with this embodiment.

FIGS. 22 to 27 show yet another embodiment of a board in accordance with the invention.

Figure 22:
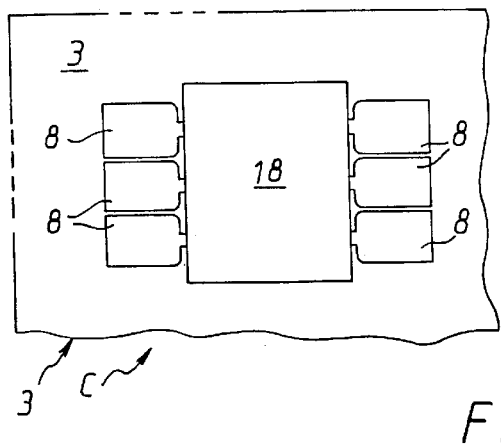

FIG. 22 shows a partial view from above of the board in accordance with this example embodiment.

Figure 23:
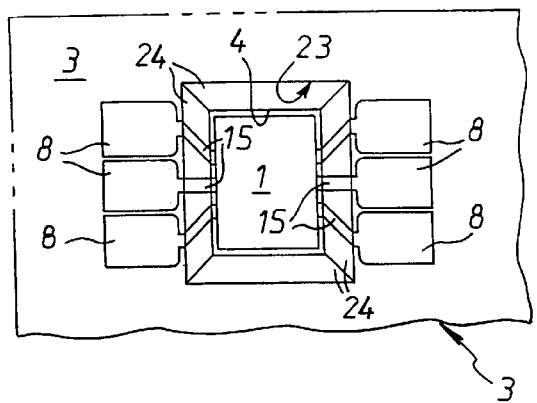

FIG. 23 shows a partial view from above of the board in accordance with this example embodiment, without the protective resin being shown.

Figure 24:
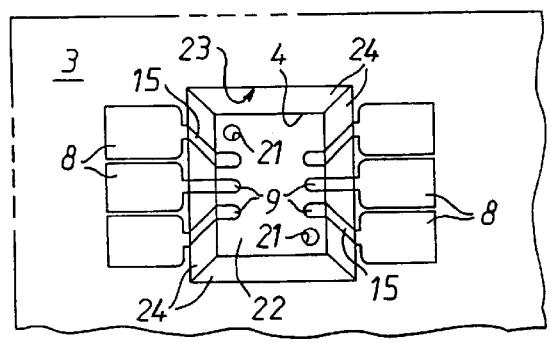

FIG. 24 is a partial view from above of the board in accordance with this embodiment without either the protective resin or the integrated circuit being shown. The strip is provided with a cavity 4; this cavity has a base 22 which forms part of the strip. Two orifices 21 are formed through the base of the cavity. These orifices permit connection between the integrated circuit and the antenna, the latter being situated between the support and the strip.

Figure 26:
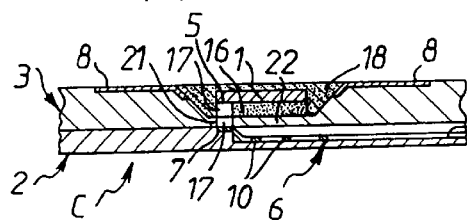

FIG. 26 is a partial sectional view of the board in accordance with this example embodiment. In particular it shows the base 22 of the cavity and one of the orifices 21 arranged in the base of this cavity. Two conductive excrescences 17 are superimposed to allow connection between the antenna and the integrated circuit. In a preferred embodiment, the conductive excrescence connected to the antenna is created by deposition of a drop of conductive adhesive, while the conductive excrescence connected to the integrated circuit is created by thermosonic melting of a metal wire. Thus, for example, a drop of conductive adhesive may be deposited within orifices 21, after the strip has been deposited on the support provided with the antenna. The connection terminals of the antenna are raised relative to the groove to facilitate connection between the antenna and the integrated circuit.

Figure 27:
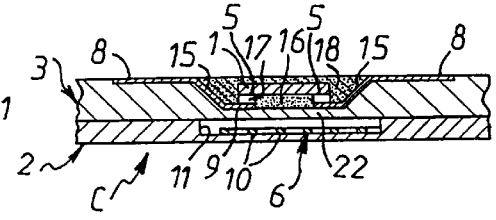

FIG. 27 is a partial sectional view of the board in accordance with this embodiment. The base of the strip isolates the antenna from the integrated circuit, this being one of the advantages of this embodiment. A further advantage arises from the fact that it is possible to produce independently, on the one hand, the antenna on the support and, on the other hand, the strip with the external contact zones, the connection terminals of the antenna and the connection tracks connecting the external contact zones to the connection terminals of the external contact zones.

Figure 25:
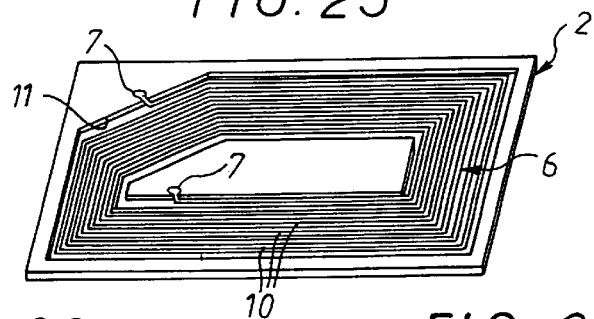

FIG. 25 shows a perspective view of the support provided with a groove in which an antenna is arranged. It also illustrates an advantage of this embodiment: more space is available width-wise for passage of the antenna under the integrated circuit, this being more accentuated as the connection ends for connection of the antenna are arranged at opposite corners of the integrated circuit.

I claim:

1. Integrated circuit board comprising:
   a support;
   a strip fixed onto the support;

a cavity defined at least partially in the support and/or the strip and having a bottom;

an integrated circuit provided with connection ends arranged in a predetermined pattern on one side thereof, the integrated circuit being mounted in the cavity;

an antenna located approximately between the support and the strip, and containing connection terminals arranged in the cavity; and external contact zones connected to other connection terminals arranged in the cavity, wherein the connection terminals and the other connection terminals define a connecting pattern in the cavity corresponding and substantially opposite to the predetermined pattern of the connection ends of the integrated circuit, whereby the connection ends of the integrated circuit are substantially facing respective connection terminals and other connection terminals and connected thereto.

2. Integrated circuit board according to claim 1, wherein the antenna includes one or more turns, the connection terminals of the external contact zones being grouped into two assemblies such that the turn(s) pass between the said two assemblies.

3. Integrated circuit board according to claim 2, wherein the antenna has more than one turn, the turns of the antenna being constricted at their passage between the said two assemblies.

4. Integrated circuit board according to claim 1, wherein a groove is present in one or both of the support and the strip and the antenna is arranged in the said groove.

5. Integrated circuit board according to claim 1, in which the external contact zones are connected to the respective connection terminals by connection tracks, wherein the external contact zones, the connection terminals of the external contact zones and the said connection tracks are produced by hot-stamping.

6. Integrated circuit board according to claim 1, wherein the integrated circuit is fixed by an anisotropic adhesive.

7. Integrated circuit board according to claim 1, wherein the integrated circuit is fixed by an insulating adhesive.

8. Integrated circuit board according to claim 1, wherein the integrated circuit has conductive excrescences on one or both of an assembly of the connection ends of the integrated circuit and an assembly of the connection terminals.

9. Integrated circuit board according to claim 8, wherein the conductive excrescences are made of metal or a conductive adhesive.

10. Integrated circuit board according to claim 8, wherein the integrated circuit is fixed by conductive adhesive deposited on one or more of an assembly of the conductive excrescences, an assembly of the connection ends of the integrated circuit, and an assembly of the connection terminals.

11. Integrated circuit board according to claim 1, wherein the external contact zones and the connection terminals of the said external contact zones are arranged on the strip.

12. Integrated circuit board according to claim 1, wherein two or more superimposed conductive excrescences are present on an assembly of connection ends of the integrated circuit and/or on an assembly of connection terminals.

13. Integrated circuit board according to claim 1, wherein the external contact zones and the antenna are on the support and by the fact that the strip is conformed to allow access to the external contact zones.

14. Integrated circuit board according to claim 1, wherein a resin protects the integrated circuit.

* * * * *